(12) United States Patent
Park et al.

(10) Patent No.: US 11,245,097 B2
(45) Date of Patent: Feb. 8, 2022

(54) DISPLAY DEVICE HAVING A HOLLOW POLYMER ENCAPSULATION LAYER

(71) Applicant: Samsung Display Co., LTD., Yongin-si (KR)

(72) Inventors: Jiyun Park, Hwaseong-si (KR); Young Gu Kim, Yongin-si (KR); Jongmin Ok, Hwaseong-si (KR); Sun-Young Chang, Seoul (KR); Hyelim Jang, Hwaseong-si (KR); Kyungseon Tak, Hwaseong-si (KR); Baekkyun Jeon, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 16/892,554

(22) Filed: Jun. 4, 2020

(65) Prior Publication Data

US 2021/0098741 A1 Apr. 1, 2021

(30) Foreign Application Priority Data

Sep. 26, 2019 (KR) .......................... 10-2019-0118539

(51) Int. Cl.
 *H01L 51/52* (2006.01)
 *H01L 27/32* (2006.01)
(52) U.S. Cl.
 CPC ........ *H01L 51/5253* (2013.01); *H01L 27/323* (2013.01); *H01L 2251/301* (2013.01); *H01L 2924/01009* (2013.01)

(58) Field of Classification Search
 CPC ............... H01L 51/5253; H01L 27/323; H01L 2251/301; H01L 2924/01009
 See application file for complete search history.

(56) References Cited

U.S. PATENT DOCUMENTS

| | | | | |
|---|---|---|---|---|
| 4,459,506 A | * | 7/1984 | Beck | ......................... H01K 1/32 313/315 |
| 7,621,794 B2 | * | 11/2009 | Lee | ..................... H01L 51/5256 445/25 |
| 7,663,306 B2 | * | 2/2010 | Imamura | ............. H01L 51/5228 313/506 |
| 8,049,948 B2 | * | 11/2011 | Hakii | ................... C09D 129/14 359/265 |
| 8,570,639 B2 | * | 10/2013 | Masuzawa | .............. G02F 1/167 359/296 |
| 9,091,899 B2 | * | 7/2015 | Seong | .................. G02F 1/16756 |
| 9,412,905 B2 | * | 8/2016 | Su | .............................. F21K 9/64 |
| 9,799,854 B2 | * | 10/2017 | Ramadas | ............. H01L 51/5256 |
| 10,062,855 B2 | * | 8/2018 | Yoo | ......................... H01L 23/28 |
| 10,181,577 B1 | * | 1/2019 | Choi | .......................... B32B 7/06 |
| 10,202,683 B2 | | 2/2019 | Lee et al. | |
| 10,330,977 B2 | * | 6/2019 | Lim | ....................... G02F 1/1334 |
| 2006/0203327 A1 | * | 9/2006 | Yasuda | ................... G02F 1/167 359/296 |

(Continued)

FOREIGN PATENT DOCUMENTS

KR 10-0608200 B1 8/2006

*Primary Examiner* — Ida M Soward
(74) *Attorney, Agent, or Firm* — Cantor Colburn LLP (57) ABSTRACT

A display device including a light emitting element layer, an encapsulation layer disposed on the light emitting element layer, wherein the encapsulation layer includes a hollow polymer structure, and an input sensor disposed on the encapsulation layer.

20 Claims, 9 Drawing Sheets (56) References Cited

U.S. PATENT DOCUMENTS

| | | | | |
|---|---|---|---|---|
| 2007/0111002 A1* | 5/2007 | Xia | ............... | C08F 112/08 |
| | | | | 428/407 |
| 2012/0063145 A1* | 3/2012 | Matsuzaki | ............ | G02B 5/265 |
| | | | | 362/293 |
| 2012/0243090 A1* | 9/2012 | Nakashima | ......... | G02B 5/3025 |
| | | | | 359/488.01 |
| 2013/0105854 A1* | 5/2013 | Jang | ................ | H01L 33/502 |
| | | | | 257/100 |
| 2014/0306187 A1* | 10/2014 | Kim | ................ | C08L 51/00 |
| | | | | 257/40 |
| 2016/0118556 A1* | 4/2016 | Lim | ................ | H01L 33/56 |
| | | | | 257/88 |
| 2018/0340674 A1* | 11/2018 | Koole | ............. | C23C 16/45525 |

\* cited by examiner

DISPLAY DEVICE HAVING A HOLLOW POLYMER ENCAPSULATION LAYER

CROSS-REFERENCE TO RELATED APPLICATIONS

This U.S. non-provisional patent application claims priority and all the benefits accruing therefrom under 35 U.S.C. § 119 of Korean Patent Application No. 10-2019-0118539, filed on Sep. 26, 2019, the contents of which in its entirety is herein incorporated by reference.

BACKGROUND

1. Field

The present disclosure relates to a display device, and more particularly, to a display device including an encapsulation layer having a low dielectric constant.

2. Description of the Related Art

Various types of display devices are used to provide image information, and the development of self-luminescent display devices using organic electroluminescent materials or quantum dot light-emitting materials is underway.

A self-luminescent display device includes a light emitting element, and the light emitting element is vulnerable to an external environment such as oxygen and moisture, so that various techniques for sealing the light emitting element are desired. Among the techniques, a technique of disposing an encapsulation layer on a light emitting element in order to block penetration of air, moisture, and the like is being developed. Such an encapsulation layer may include a structure in which an inorganic film including inorganic matter and an organic film including organic matter are alternately stacked.

However, when an input sensor such as a touch panel is provided on the encapsulation layer, there may be problems in that, due to the encapsulation layer, the touch sensitivity of the input sensor may be deteriorated or a malfunction of the input sensor may occur.

SUMMARY

The present disclosure provides a display device including an encapsulation layer having a reduced dielectric constant.

The present disclosure also provides a display device which includes an encapsulation layer having a reduced dielectric constant, thereby having an improved operation quality of an input sensor disposed on the encapsulation layer.

An embodiment as disclosed herein provides a display device including a light emitting element layer, an encapsulation layer disposed on the light emitting element layer, wherein the encapsulation layer comprises a hollow polymer structure, and an input sensor disposed on the encapsulation layer.

In an embodiment, the encapsulation layer may further include a fluorine-containing dispersant.

In an embodiment, the encapsulation layer may include at least one organic film and at least one inorganic film, and wherein the at least one organic film may include the hollow polymer structure and the fluorine-containing dispersant.

In an embodiment, the hollow polymer structure may include a core part filled with air and a shell part surrounding the core part.

In an embodiment, the shell part may include a (meth)acryl polymer, an imide polymer, a urethane polymer, a styrenic polymer, a siloxane polymer, an epoxy polymer, or a combination thereof.

In an embodiment, the shell part may include polymethylmethacrylate, polyimide, polyurethane, polystyrene, polycarbonate, polyethylene, polypropylene, cellulose acetate, or a combination thereof.

In an embodiment, the hollow polymer structure may have a spherical shape having an average diameter of 10 nanometers (nm) to 200 nm.

In an embodiment, the shell part may have a thickness of 5 nm to 50 nm.

In an embodiment, the fluorine-containing dispersant may be represented by Formula 1 below, or may be a reaction product of a compound represented by Formula 1 below.

Formula 1

In Formula 1 above, $X_1$ and $X_2$ may each be independently a reactive group including an acrylate group or a fluorine (F) atom, Y may be O, S, $CR_1R_2$ or $NR_3$, and $R_1$ to $R_3$ may each be independently a hydrogen (H) atom or an fluorine atom, $R_a$ to $R_f$ may each be independently an fluorine (F) atom or $(CF_2)_zCF_3$, n may be an integer of 1 to 5, and m and z may each be independently an integer of 1 to 10.

In an embodiment, the at least one organic film and the at least one inorganic film may be alternately stacked.

In an embodiment, the encapsulation layer may cover the light emitting element layer.

In an embodiment, the light emitting element layer may be an organic electroluminescent element layer or a quantum dot light emitting element layer.

In an embodiment, the input sensor may be directly disposed on a portion of the encapsulation layer opposite the light emitting layer.

In an embodiment, a display device includes a light emitting element layer, an encapsulation layer disposed on the light emitting element layer, and an input sensor disposed on the encapsulation layer, wherein the encapsulation layer includes at least one organic film formed from an encapsulation composition including a base resin, a hollow polymer structure, and a fluorine-containing dispersant.

In an embodiment, the encapsulation composition may include 45 weight percent (wt %) to 88 wt % of the base resin, 10 wt % to 50 wt % of the hollow polymer, and 1 wt % to 5 wt % of the fluorine-containing dispersant, based on the total weight of the encapsulation composition.

In an embodiment, the base resin may include a (meth)acryl unit, a silicone unit, a urethane unit, an imide unit, or a combination thereof.

In an embodiment, the hollow polymer may include a core part filled with air and a shell part surrounding the core part.

In an embodiment, the fluorine-containing dispersant may include a polymerizable reactive group which reacts with the base resin.

In an embodiment, the encapsulation layer may further include at least one inorganic film and the at least one organic film, wherein the at least one organic film and the at least one inorganic film are alternately stacked and the at least one inorganic film may include at least one of SiNx, SiOx, or SiOxNy.

In an embodiment, the at least one organic film may have a dielectric constant of 1.0 to 2.6.

BRIEF DESCRIPTION OF THE FIGURES

The accompanying drawings are included to provide a further understanding of the disclosure, and are incorporated in and constitute a part of this specification. The above advantages and other aspects of this disclosure will become apparent and more readily appreciated from the following description of the embodiments, taken in conjunction with the accompanying drawings in which.

DETAILED DESCRIPTION

Example embodiments of the present disclosure will now be described more fully with reference to the accompanying drawings, in which example embodiments are shown, and described in detail. It should be understood, however, that this disclosure may be embodied in many different forms, should not be construed as being limited to the embodiments set forth herein, but rather, is intended to cover all modifications, equivalents, and alternatives within the spirit and scope of the present disclosure, rather, these embodiments are provided so that this disclosure will be thorough and complete, and will fully convey the effects and features of the disclosure and ways to implement the disclosure to those skilled in the art.

The terminology used herein is for the purpose of describing particular embodiments only and is not intended to be limiting. As used herein, "a," "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

In the present disclosure, being "directly disposed" means that there is no layer, film, region, plate or the like added between a portion of a layer, a film, a region, a plate, or the like and other portions. For example, being "directly disposed" may mean being disposed without additional members such as an adhesive member between two layers or two members.

Like reference numerals refer to like elements. Also, in the drawings, the thickness, the ratio, and the dimensions of elements are exaggerated for an effective description of technical contents.

As used herein, the slash "/" or the term "and/or" includes any and all combinations of one or more of the associated listed items, or associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings. In the present disclosure, being "disposed on" may not only include the case of being disposed on an upper portion of any one member but also the case of being disposed on a lower portion thereof. Thus, the exemplary term "below" can encompass both an orientation of above and below. The device may be otherwise oriented (rotated 90 degrees or at other orientations) and the spatially relative descriptors used herein interpreted accordingly.

Values disclosed herein are inclusive of the stated value and include an acceptable range of deviation for the particular value as determined by one of ordinary skill in the art, considering the measurement in question and the error associated with measurement of the particular quantity (i.e., the limitations of the measurement system). For example, values disclosed herein may include within one or more standard deviations, or within ±10% or ±5% or ±1% of the stated value.

Unless otherwise defined, all terms (including technical and scientific terms) used herein have the same meaning as commonly understood by one of ordinary skill in the art to which the disclosure pertains. It is also to be understood that terms defined in commonly used dictionaries should be interpreted as having meanings consistent with the meanings in the context of the related art, and are interpreted as being expressly defined herein unless they are interpreted in an ideal or overly formal sense.

It should be understood that the terms "comprise" and/or "comprising," or "have" are intended to specify the presence of stated features, integers, steps, operations, elements, components, and/or combinations thereof in the disclosure, but do not preclude the presence or addition of one or more other features, integers, steps, operations, elements, components, or combinations thereof.

Hereinafter, a display device according to an embodiment of the disclosure will be described with reference to the accompanying drawings.

Figure 1:
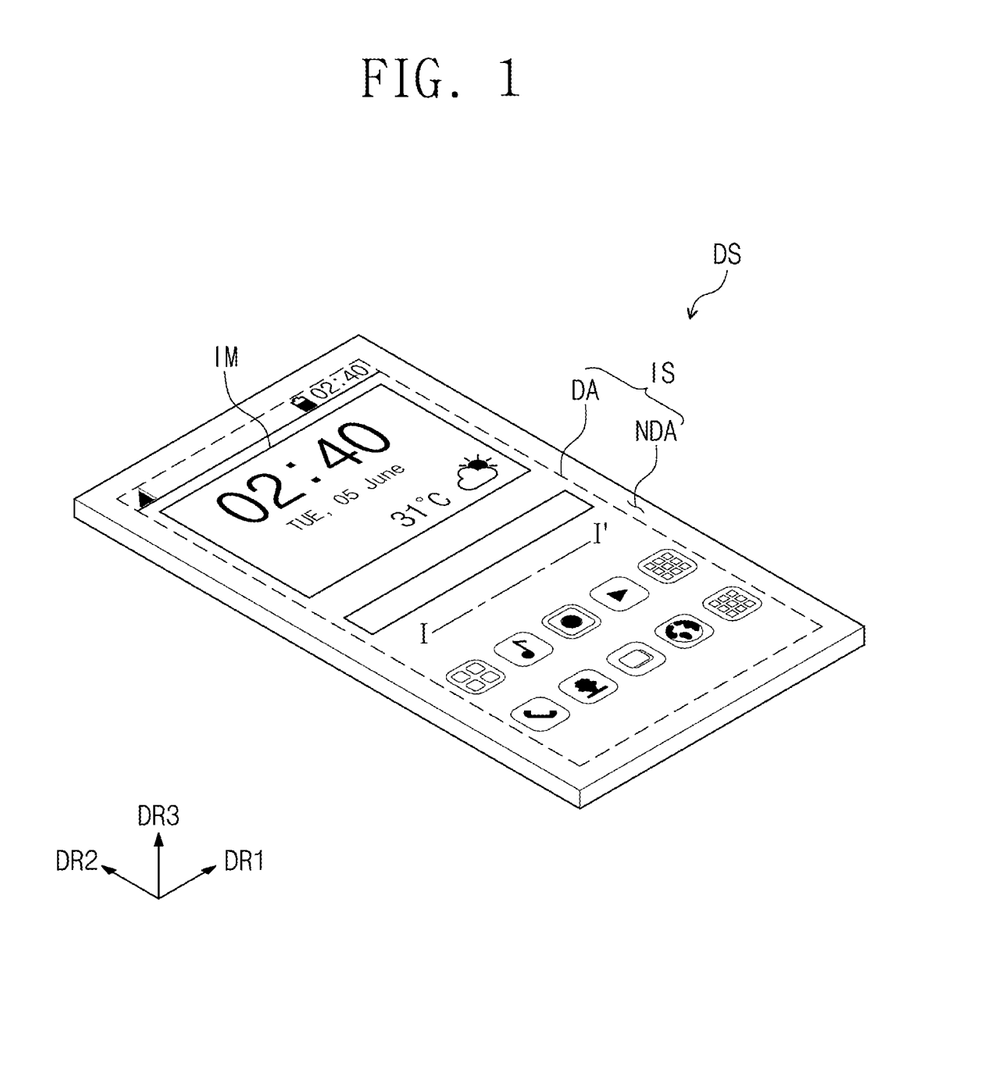
FIG. 1 is a perspective view of a display device according to an embodiment of the disclosure.
Figure 2:
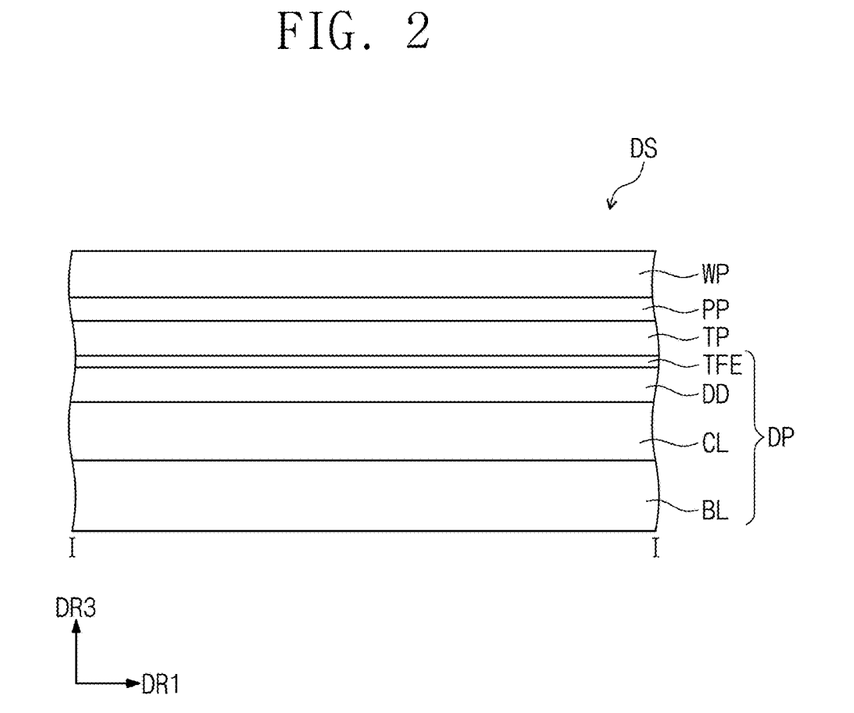
FIG. 2 is a cross-sectional view of the display device illustrated in FIG. 1.
Figure 3:
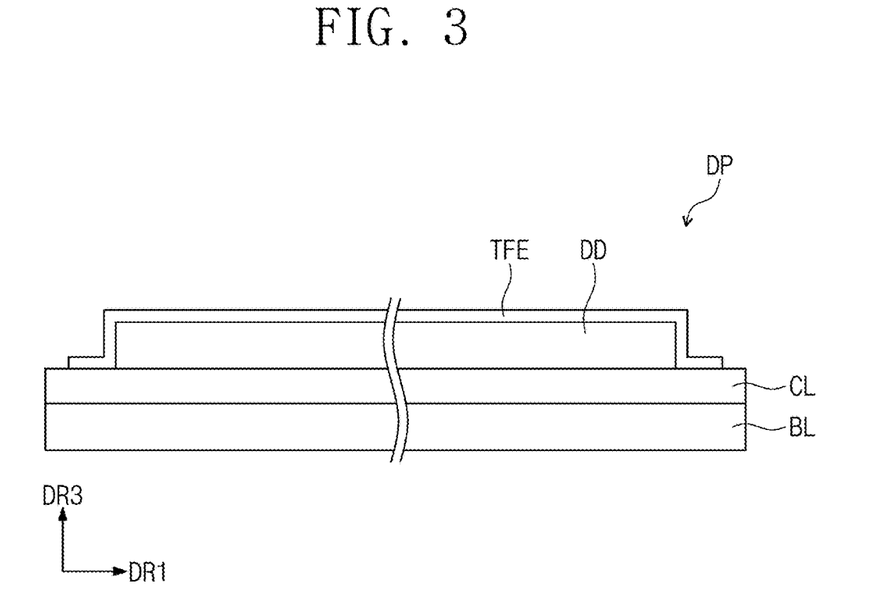
FIG. 3 is a cross-sectional view of a display panel according to an embodiment of the disclosure.
Figure 4:
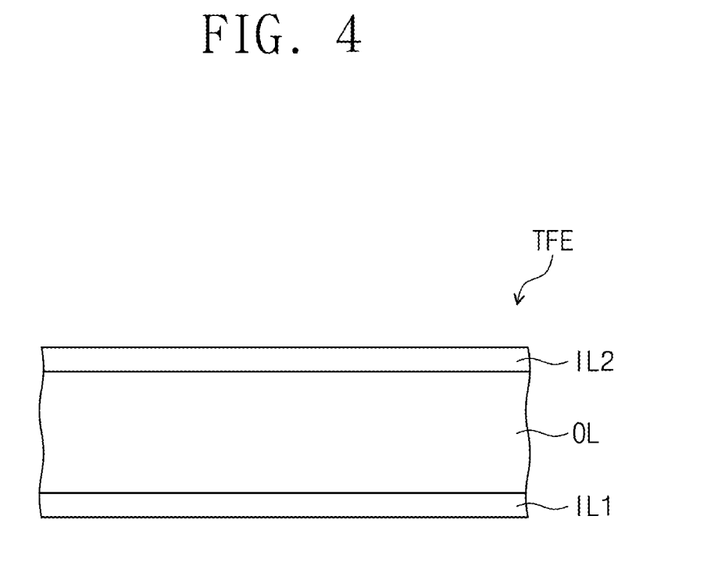
FIG. 4 is a plan view of an encapsulation layer according to an embodiment of the disclosure.
Figure 5:
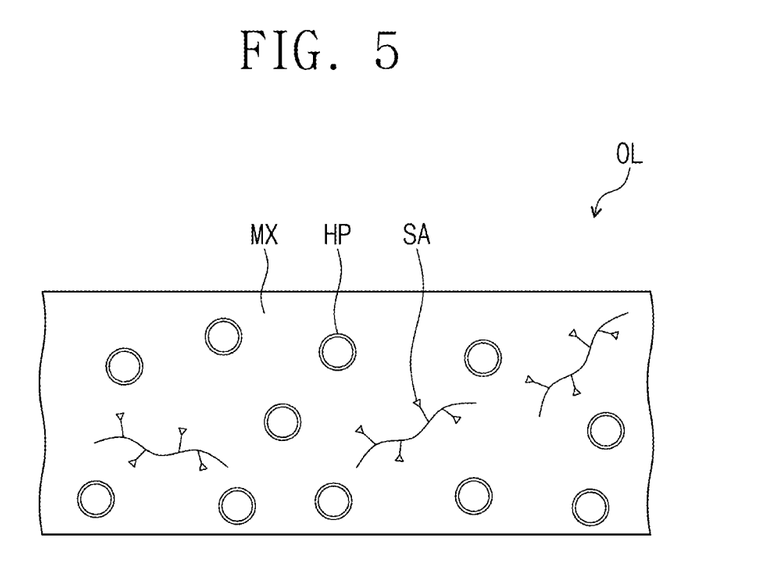
FIG. 5 is a cross-sectional view showing a portion of an encapsulation layer according to an embodiment of the disclosure.
Figure 6:
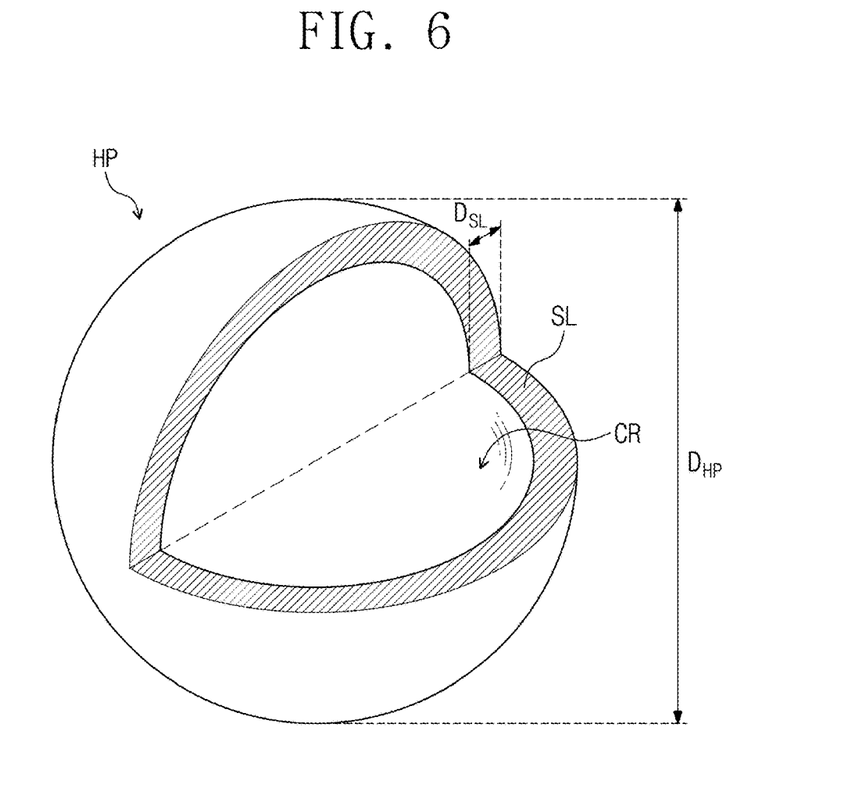
FIG. 6 is a perspective view of a hollow polymer structure according to an embodiment of the disclosure.

FIG. 1 is a perspective view of a display device of an embodiment, and FIG. 2 is a cross-sectional view of a display device of an embodiment. FIG. 2 is a cross-sectional view showing a portion corresponding to line I-I' of FIG. 1. FIG. 3 is a cross-sectional view showing a display panel included in a display device of an embodiment. FIG. 4 is a cross-sectional view of an encapsulation layer according to an embodiment. FIG. 5 is a cross-sectional view of an organic film included in an encapsulation layer of an embodiment. FIG. 6 is a perspective view showing a hollow polymer structure included in an encapsulation layer according to an embodiment.

Referring to FIG. 1, a display device DS may display an image IM through a display surface IS. In FIG. 1, the display surface IS is illustrated as being parallel to a surface defined by a first direction axis DR1 and a second direction axis DR2 crossing the first direction axis DR1. However, this is only exemplary. In an embodiment, a display surface of a display device may have a curved shape.

The normal direction of the display surface IS, that is, the thickness direction of the display device DS is indicated by a third direction axis DR3. A front surface (or an upper surface) and a back surface (or a lower surface) of each member are defined by the third direction axis DR3. However, directions indicated by the first to third direction axes DR1, DR2, and DR3 respectively are relative to each other, and may be converted to different directions.

In FIG. 1, the display device DS is exemplarily illustrated as being a portable electronic apparatus. However, the display device DS may be used for large electronic devices such as a television, a monitor, or an external advertisement board, and also for small and medium-sized electronic devices such as a personal computer, a notebook computer, a personal digital terminal, a car navigation system unit, a game machine, a smart phone, a tablet, and a camera. However, these are merely exemplary embodiments, and the display device DS may be employed in other electronic devices as long as it does not depart from the scope of the disclosure.

The display surface IS includes a display region DA in which the image IM is displayed and a non-display region NDA adjacent to the display region DA. The non-display region NDA is a region in which the image IM is not displayed. In FIG. 1, as an example of the image IM, a watch window and application icons are illustrated.

The display region DA may have a quadrangular shape. The non-display region NDA may surround the display region DA. However, the embodiment of the disclosure is not limited thereto. The shape of the display region DA and the shape of the non-display region NDA may be correlatively designed. Also, the non-display region NDA may not be present on a front surface of the display device DS.

As illustrated in FIG. 2, the display device DS of an embodiment may include a light emitting element layer DD and an encapsulation layer TFE disposed on the light emitting element layer DD. The encapsulation layer TFE may cover the light emitting element layer DD. The encapsulation layer TFE may partially or fully (preferably fully) cover the light emitting layer DD. In the display device DS of an embodiment, an input sensor TP may be disposed on the encapsulation layer TFE. In an embodiment, the input sensor TP may be directly disposed on the encapsulation layer TFE. As shown in FIG. 3, the encapsulation layer TFE may be disposed surrounding the light emitting element layer DD to seal the light emitting element layer DD. As shown in FIG. 4, the encapsulation layer TFE may include at least one organic film OL and at least one inorganic film IL1 or IL2.

In the display device DS of an embodiment, the encapsulation layer TFE may include a hollow polymer structure HP, which for convenience herein may also be referred to as "hollow polymer HP". For example, as illustrated in FIG. 5, in an embodiment, the at least one organic film OL of the encapsulation layer TFE may include the hollow polymer HP. Also, in the display device DS of an embodiment, the encapsulation layer TFE (see FIG. 4) may include the hollow polymer HP and a fluorine-containing dispersant SA. Also, in the display device DS of an embodiment, the at least one organic film OL of the encapsulation layer TFE may include the hollow polymer HP and the fluorine-containing dispersant SA.

FIG. 6 is a perspective view showing a portion of the hollow polymer HP included in the encapsulation layer TFE (see FIG. 4) according to an embodiment. FIG. 6 is a view for describing the inside of the hollow polymer HP, the view excluding a portion of the hollow polymer HP. For example, in an embodiment, the hollow polymer HP may have a spherical shape.

The hollow polymer HP may include a core part CR and a shell part SL surrounding the core part CR. The core part CR may be defined by the shell part SL. The shell part SL may be continuous or discontinuous, and is preferably continuous.

The shell part SL may include a (meth)acryl polymer, an imide polymer, a urethane polymer, a siloxane polymer, a vinyl polymer, an epoxy polymer, or a combination thereof, which are inclusive of a (meth)acryl-based polymer, an imide-based polymer, a urethane-based polymer, a styrenic polymer, a siloxane-based polymer, a vinyl-based polymer, an epoxy-based polymer, or a combination thereof. In the present disclosure, a compound represented by "~~-based" may refer to a compound including the moiety "~~." For example, a (meth)acryl-based polymer corresponds to a polymer material including a (meth)acryl group ($H_2C=CR(C=O)O-$, wherein R is hydrogen (acryl) or methyl (methacryl)). In an embodiment, the acryl polymer contains a methacrylate group.

In an embodiment, the shell part SL may include polymethylmethacrylate, polyimide, polyurethane, polystyrene, polycarbonate, polyethylene, polypropylene, cellulose acetate, or a combination thereof.

The core part CR of the hollow polymer HP may be filled with air. The embodiment of the disclosure is not limited thereto. The core part CR of the hollow polymer HP may be filled with a liquid or a gas having low dielectric constant properties.

The hollow polymer HP may have an average diameter $D_{HP}$ of 10 nm to 200 nm. For example, the average diameter $D_{HP}$ of the hollow polymer HP may be 20 nm to 100 nm. In an embodiment, the diameter $D_{HP}$ of the hollow polymer HP may represent a diameter to the outermost periphery of the shell part SL.

The encapsulation layer TFE according to an embodiment may include a plurality of hollow polymers HP, and the plurality of hollow polymers HP may each have a different diameter. For example, the encapsulation layer TFE may include the plurality of hollow polymers HP having different diameters. By allowing the average diameter Dip of the hollow polymer HP to be 10 nm to 200 nm, the thickness and transmittance of the encapsulation layer TFE may be optimized.

In the hollow polymer HP, the shell part SL may have a thickness $D_{SL}$ of 5 nm to 50 nm, for example, 10 nm to 45 nm, 15 nm to 40 nm, 20 nm to 35 nm, 25 nm to 30 nm. By allowing the thickness $D_{SL}$ of the shell part SL to be 5 nm to 50 nm, the strength of the hollow polymer HP may be maintained while maximizing the volume of the core part CR.

In an embodiment, the encapsulation layer TFE may exhibit a low dielectric constant value by including the hollow polymer HP. For example, the organic film OL including the hollow polymer HP may have a dielectric constant value of 1.0 to 2.6. For example, the dielectric constant value of the organic film OL including the hollow polymer HP may be 2.0 to 2.5, or 1.5 to 2.4, or 1.8 to 2.2.

The smaller the dielectric constant value of the encapsulation layer TFE, a parasitic capacitance Cp between the encapsulation layer TFE and the input sensor TP is also reduced in the display device DS of an embodiment. That is, as the dielectric constant value of the encapsulation layer TFE is reduced, the sensitivity of the input sensor TP is increased.

The encapsulation layer TFE may further include the fluorine-containing dispersant SA in addition to the hollow polymer HP. The fluorine-containing dispersant SA may be an oligomer including at least one fluoro group. The fluorine-containing dispersant SA may ease an agglomeration phenomenon of the plurality of hollow polymers HP. The fluorine-containing dispersant SA may allow the hollow polymers HP to be randomly dispersed and disposed in the encapsulation layer TFE.

The fluorine-containing dispersant SA may be represented by Formula 1 below, or a reaction product of a compound represented by Formula 1 below.

Formula 1

In Formula 1 above, $X_1$ and $X_2$ are each independently a reactive group including an acrylate group or a fluoro (fluorine, F) atom, m is an integer of 1 to 10, and n is an integer of 1 to 5. In Formula 1, Y is O, S, $CR_1R_2$, or $NR_3$, and $R_1$ to $R_3$ are each independently a hydrogen (H) atom, or an F atom. $R_a$ to $R_f$ are each independently an F atom or $(CF_2)_zCF_3$, and z is an integer of 1 to 10. As further described below, when $X_1$, $X_2$, or both are a reactive group, the reactive group may react with a base resin to provide a reaction product.

For example, in the fluorine-containing dispersant SA represented by Formula 1, $R_a$ to $R_f$ may all be F atoms, or at least one, or at least two, or at least 3 thereof may include a side chain represented by $(CF_2)_zCF_3$.

The fluorine-containing dispersant SA according to an embodiment may be represented by Formula 1-1 below, or a reaction product thereof.

Formula 1-1

In Formula 1-1, the same content as the content described with reference to Formula 1 may be applied to $X_1$, $X_2$, Y, m, and n.

Also, $(CF_2)_zCF_3$, which is coupled as a side chain, may be represented by Formula 1-2 below. In Formula 1-2 below, "— * ——" is a bond to be coupled to the main chain.

Formula 1-2

Figure 7:
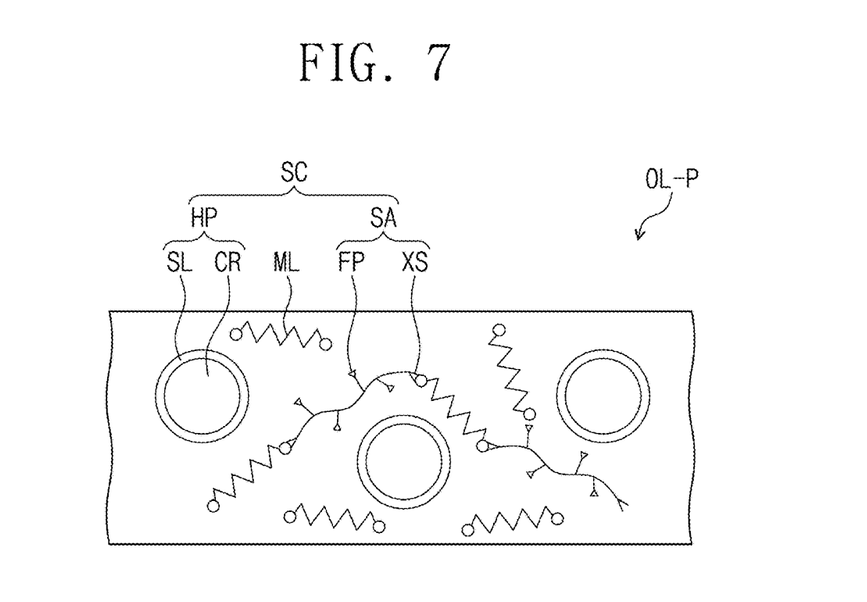
FIG. 7 is a cross-sectional view showing a portion of a preliminary encapsulation layer according to an embodiment of the disclosure.

In the fluorine-containing dispersant SA represented by Formula 1, $X_1$ and $X_2$ may be polymerizable reactive groups XS (see FIG. 7). For example, $X_1$ and $X_2$ may be photopolymerizable reactive groups each including an acrylate group and may be connected to a base resin ML adjacent thereto (see FIG. 7).

As shown in FIG. 5, the organic film OL of the encapsulation layer TFE may include a matrix part MX, the hollow polymer HP dispersed in the matrix part MX, and the fluorine-containing dispersant SA. The fluorine-containing dispersant SA may allow the hollow polymer HP to be uniformity dispersed in the matrix part MX without being agglomerated.

FIG. 7 is a cross-sectional view showing a preliminary organic film. A preliminary organic film OL-P illustrated in FIG. 7 represents a state in which an encapsulation composition SC is provided. The preliminary organic film OL-P may represent a state before heat or ultraviolet light is provided to the encapsulation composition SC. The organic film OL (see FIG. 5) of the encapsulation layer TFE may be formed from the encapsulation composition SC. The organic film OL (see FIG. 5) may be formed by providing heat or ultraviolet light to the preliminary organic film OL-P provided with the encapsulation composition SC, thereby inducing a polymerization reaction.

As illustrated in FIG. 7, the encapsulation composition SC may include the base resin ML and the hollow polymer HP. In order to improve the dispersibility of the hollow polymers HP, the encapsulation composition SC may include the fluorine-containing dispersant SA. The encapsulation composition SC may form at least one organic film of the encapsulation layer TFE. For example, when the encapsulation layer TFE includes a plurality of organic films, one or more organic films selected among the plurality of organic films may be formed from the encapsulation composition SC including the hollow polymer HP.

The base resin ML may include units formed from a (meth)acryl-based monomer, a silicon-based monomer, a urethane-based monomer, an imide-based monomer, or a combination thereof. The hollow polymer HP includes the core part CR and the shell part SL, and the fluorine-containing dispersant SA may include at least one fluoro group FP. In an embodiment, the fluorine-containing dispersant SA may have a polymerizable reactive group XS at an end thereof. The at least one fluoro group FP may be a portion coupled as a side chain in the fluorine-containing dispersant SA provided in the form of an oligomer.

The polymerizable reactive group XS of the fluorine-containing dispersant SA may include a (meth)acryl group, preferably (meth)acrylate group. In an embodiment the fluorine-containing dispersant SA may include a methacryl group, preferably a methacrylate. The polymerizable reactive group XS may be coupled to the base resin ML. When heat or ultraviolet light is provided to the encapsulation composition SC, the polymerizable reactive group XS is coupled to the base resin ML, and accordingly, the fluorine-containing dispersant SA is fixed in the matrix part MX (for MX, see FIG. 5) formed from the base resin ML.

In an embodiment, the polymerizable reactive group XS of the fluorine-containing dispersant SA may not react with the hollow polymer HP, and the hollow polymers HP may be separated and dispersed from each other by the fluoro group FP.

Figure 8A:
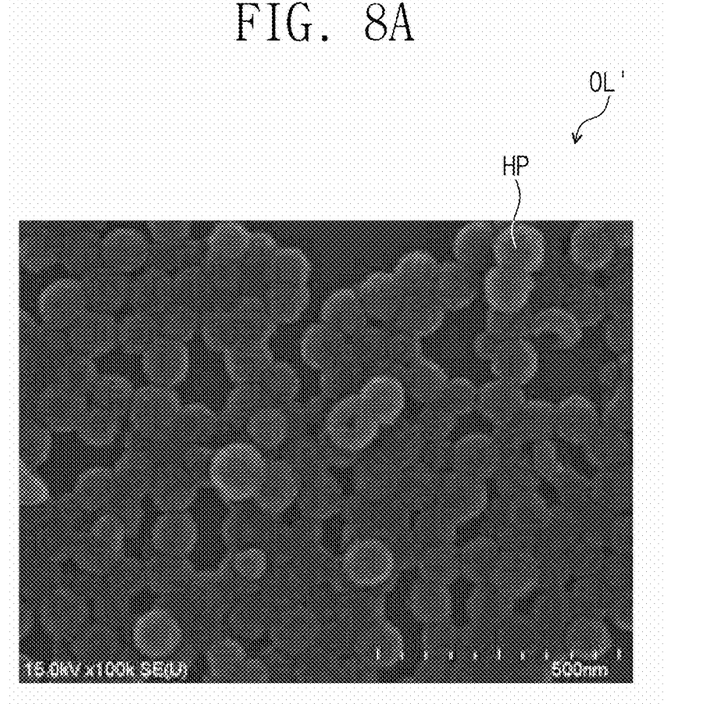
FIG. 8A and FIG. 8B are images each showing a portion of an encapsulation layer.
Figure 8B:
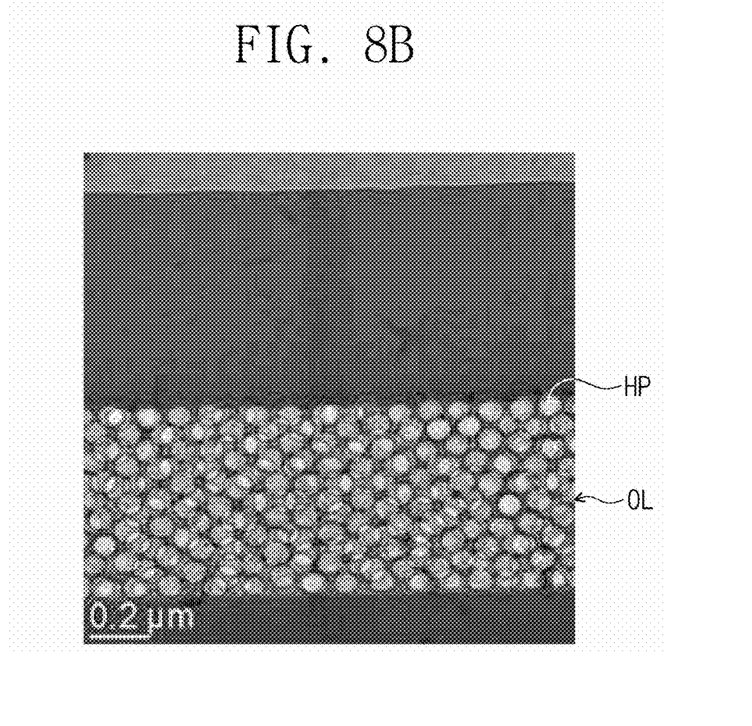

FIG. 8A is an image of an organic film OL' not including a fluorine-containing dispersant but including only the hollow polymer HP, and FIG. 8B is an image of the organic film OL including a fluorine-containing dispersant. It can be confirmed that the hollow polymer HP is more uniformity dispersed in the organic film OL of FIG. 8B than in the organic film OL' of FIG. 8A. That is, when the organic film OL includes a fluorine-containing dispersant in an embodiment, the hollow polymer HP may be uniformity dispersed and disposed in the organic film OL without being agglomerated.

In an embodiment, when the encapsulation composition SC includes the base resin ML and the hollow polymer HP, the base resin ML may be included in an amount of 45 wt % to 90 wt % and the hollow polymer HP may be included in an amount of 10 wt % to 55 wt % based on the total weight of the base resin ML and the hollow polymer HP.

In an embodiment, when the encapsulation composition SC includes the base resin ML, the hollow polymer HP, and the fluorine-containing dispersant SA, the base resin ML may be included in an amount of 45 wt % to 88 wt %, for example, 50 wt % to 80 wt % of the base resin, 55 wt % to 75 wt % of the base resin, 60 wt % to 70 wt % of the base resin; the hollow polymer HP may be included in an amount of 10 wt % to 50 wt %, for example, 15 wt % to 45 wt % of the hollow polymer, 20 wt % to 40 wt % of the hollow polymer, 25 wt % to 35 wt % of the hollow polymer; and the fluorine-containing dispersant SA may be included in an amount of 1 wt % to 5 wt %, for example, 1.5 wt % to 4.5 wt % of the fluoro dispersant, 2 wt % to 4 wt % of the fluoro dispersant, 2.5 wt % to 3.5 wt % of the fluoro dispersant, based on the total weight of the encapsulation composition SC. For example, in the encapsulation composition SC, the fluorine-containing dispersant SA may be included in equal to or less than 10% of the content of the hollow polymer HP. For example, the at least one organic film OL (see FIG. 4) included in the encapsulation layer TFE (see FIG. 4) according to an embodiment may be formed from the encapsulation composition SC including 45 wt % of the base resin ML, 50 wt % of the hollow polymer HP, and the 5 wt % of the fluorine-containing dispersant SA.

The organic film OL (see FIG. 5) formed from the encapsulation composition SC may have a dielectric constant of 1.0 to 2.6. For example, the dielectric constant value of the organic film OL (see FIG. 5) formed from the encapsulation composition SC may be 2.0 to 2.5.

Figure 9:
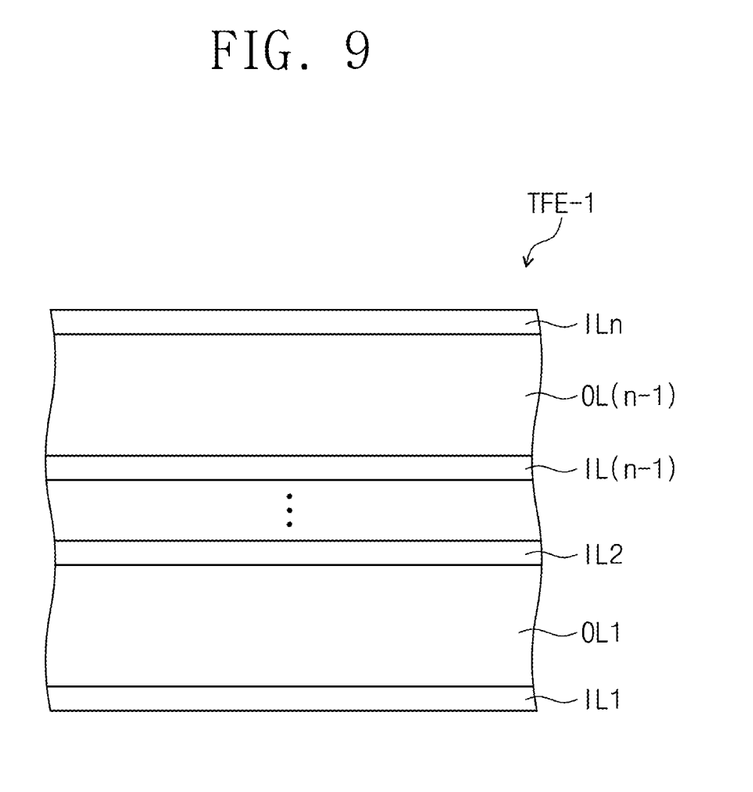
FIG. 9 is a cross-sectional view showing an encapsulation layer according to an embodiment of the disclosure.

FIG. 9 is a cross-sectional view of an encapsulation layer TFE-1 according to an embodiment. Referring to FIG. 4 and FIG. 9, the encapsulation layer TFE includes at least one organic film OL and at least one inorganic film IL1 or IL2, and the inorganic film IL1 or IL2 and the organic film OL may be alternately disposed. For example, the encapsulation layer TFE may include two inorganic films IL1 and IL2 and the organic film OL1 disposed therebetween. The organic film OL is formed from the encapsulation composition SC (see FIG. 7) described above, and may exhibit a low dielectric constant value by including the hollow polymer HP (see FIG. 5). Also, the inorganic films IL1 and IL2 may include at least on among silicon nitride (SiNx), silicon oxide (SiOx), or silicon oxynitride (SiOxNy). In an embodiment, x and y may each be independently greater and 0 and less than 4, but x and y are not limited to integers.

The encapsulation layer TFE-1 according to an embodiment and illustrated in FIG. 9 may include n inorganic films (IL1 to ILn) including a first inorganic film IL1 which are to be disposed on the light emitting element layer DD (see FIG. 3). In an embodiment, the first inorganic film IL1 may be disposed in direct contact with the light emitting element layer DD (see FIG. 3). The first inorganic film IL1 is defined as a lower inorganic film and inorganic layers other than the first inorganic layer IL1 among the n inorganic layers IL1 to ILn may be defined as upper inorganic layers.

The encapsulation layer TFE-1 includes n−1 organic films OL1 to OL(n−1), and the n−1 inorganic films IL1 to IL(n−1). The n−1 organic films OL1 to OL(n−1) may be alternately disposed with the n inorganic films IL to ILn. The n−1 organic films OL1 to OL(n−1) on average may each have a thickness greater than that of each of the n inorganic films IL1 to ILn.

Each of the n inorganic films IL1 to ILn may have a single layer including one material, or multiple layers each including a different material. At least one among the n−1 organic films OL1 to OL(n−1) may be formed from the encapsulation composition described above. That is, at least one among the n−1 organic films OL1 to OL(n−1) may include the hollow polymer HP (see FIG. 5) described above. In an embodiment, at least one among the n−1 organic films OL1 to OL(n−1) may include the hollow polymer HP (see FIG. 5) and the fluorine-containing dispersant SA (see FIG. 5) described above.

For example, each of the n−1 organic films OL1 to OL(n−1) may be formed by coating an encapsulation composition. Specifically, the organic films OL1 to OLn−1 may be formed by an ink jet printing method.

The display device DS of an embodiment may include the above-described encapsulation layer TFE-1 according to an embodiment. An embodiment may provide the display device DS with improved sensitivity of the input sensor TP by including the encapsulation layer TFE-1 having low dielectric constant properties.

Figure 10:
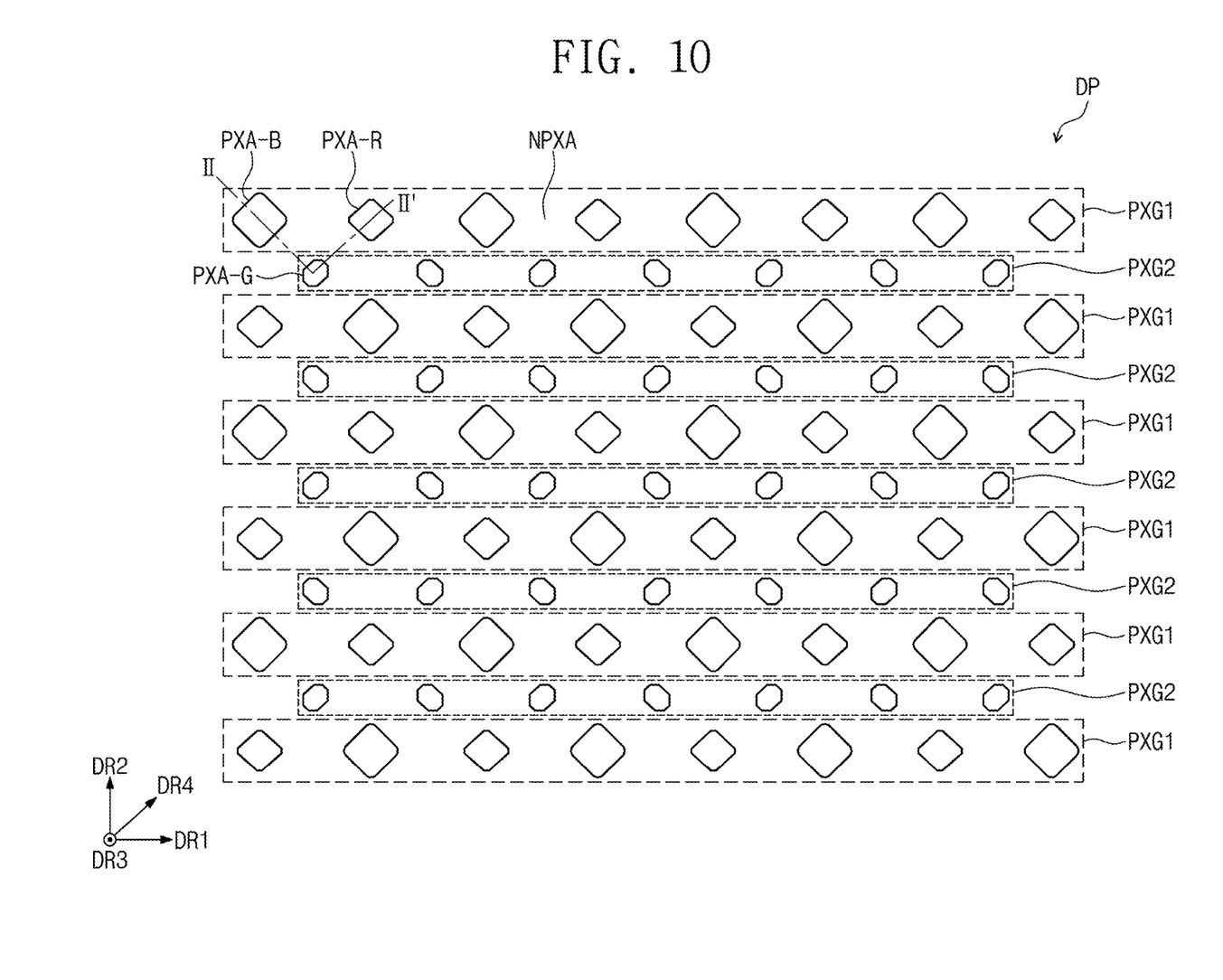
FIG. 10 is a plan view of a display panel according to an embodiment of the disclosure.
Figure 11:
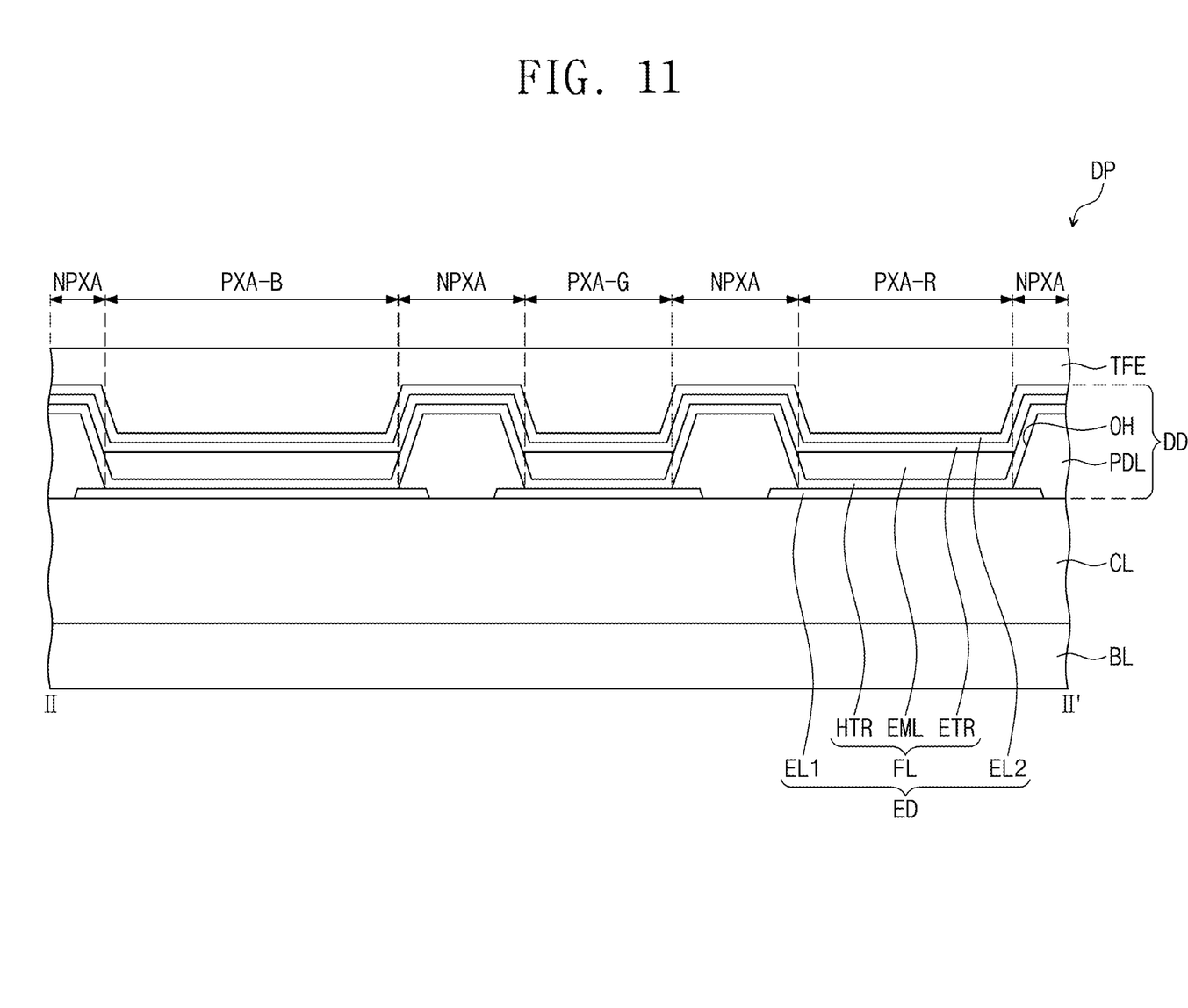
FIG. 11 is a cross-sectional view of the display panel according to an embodiment of the disclosure illustrated in FIG. 10.
Figure 12:
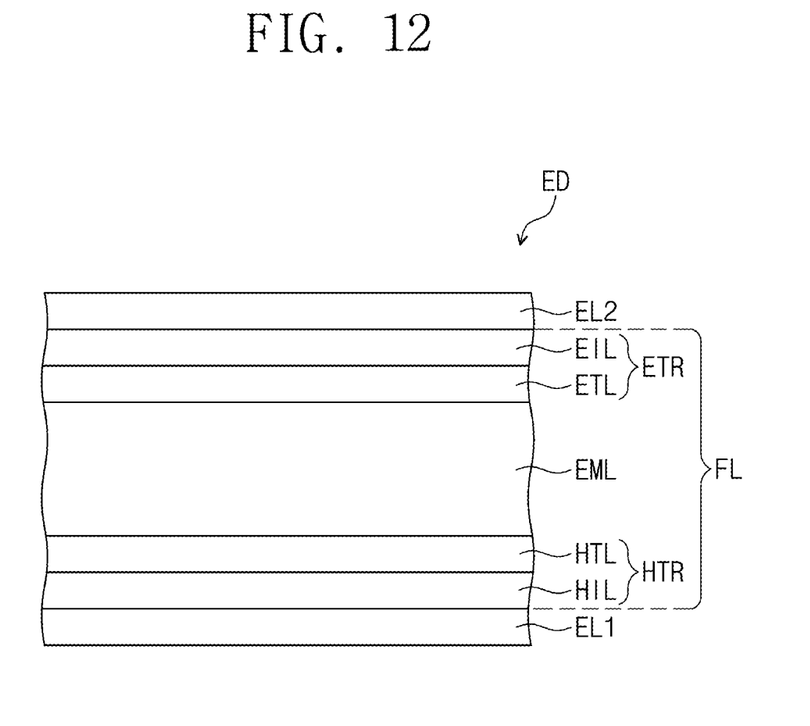
FIG. 12 is a cross-sectional view showing a light emitting element according to an embodiment of the disclosure.

FIG. 10 is a plan view of a display panel included in a display device of an embodiment, and FIG. 11 is a cross-sectional view showing a portion corresponding to line II-IF of FIG. 10. FIG. 12 is a cross-sectional view of a light emitting element according to an embodiment.

Referring to FIG. 10 and FIG. 11, the display panel DP may include a non-light emitting region NPXA and light emitting regions PXA-R, PXA-G, and PXA-B. Each of the light emitting regions PXA-R, PXA-G, and PXA-B may be a region in which light generated from a light emitting element ED is emitted. The area of each of the light emitting regions PXA-R, PXA-G, and PXA-B may be different from each other, wherein the area may mean an area when viewed on a plane.

The light emitting regions PXA-R, PXA-G, and PXA-B may be classified into a plurality of groups according to the color of light generated from the light emitting element ED. In the display panel DP of an embodiment illustrated in FIG. 10 and FIG. 11, three light emitting regions PXA-R, PXA-G, and PXA-B which respectively emit red light, green light, and blue light are exemplarily illustrated.

The light emitting regions PXA-R, PXA-G, and PXA-B may have different areas according to the color of light emitted from an emission layer EML of the light emitting element ED. For example, referring to FIG. 10, in the display panel DP of an embodiment, a blue light emitting region PXA-B of a light emitting element emitting blue light may have the greatest area, and a green light emitting region PXA-G of the light emitting element generating green light may have the smallest area. However, the embodiment of the disclosure is not limited thereto. The light emitting regions PXA-R, PXA-G, and PXA-B may emit light of different colors other than red, green, and blue, or the light emitting regions PXA-R, PXA-G, and PXA-B may have the same area. Alternatively, the light emitting regions PXA-R, PXA-G, and PXA-B may be provided in a different area ratio from the one illustrated in FIG. 10.

Each of the light emitting regions PXA-R, PXA-G, and PXA-B may be a region separated by a pixel defining layer PDL. The non-light emitting regions NPXA are regions between the light emitting regions PXA-R, PXA-G, and PXA-B, and may be regions corresponding to the pixel defining layer PDL. In an embodiment, each of the light emitting regions PXA-R, PXA-G, and PXA-B may correspond to a pixel.

The pixel defining layer PDL may be formed of a polymer resin. For example, the pixel defining layer PDL may be formed by including a polyacrylate-based resin or a polyimide-based resin. Also, the pixel defining layer PDL may be formed by further including an inorganic matter in addition to a polymer resin. In an embodiment, the pixel defining layer PDL may be formed by including a light absorbing material, or may be formed by including a black pigment or a black dye. The pixel defining layer PDL formed by including a black pigment or a black dye may implement a black pixel defining film. When the pixel defining layer PDL is formed, carbon black and the like may be used as a black pigment or a black dye, but the embodiment of the disclosure is not limited thereto.

Alternatively, the pixel defining layer PDL may be formed of an inorganic matter. For example, the pixel defining layer PDL may be formed by including silicon nitride (SiNx), silicon oxide (SiOx), silicon oxynitride (SiOxNy), or the like, for example, wherein x and y each independently are greater than 0 and less than 4. The pixel defining layer PDL may define the light emitting regions PXA-R, PXA-G, and PXA-B. The light emitting regions PXA-R, PXA-G, and PXA-B and the non-light emitting region NPXA may be separated by the pixel defining layer PDL.

The blue light emitting regions PXA-B and the red light emitting regions PXA-R may be alternately arranged along the first direction axis DR1 to form a first group PXG1. The green light emitting regions PXA-G may be arranged along the first direction axis DR1 to form a second group PXG2.

The first group PXG1 may be disposed spaced apart from the second group PXG2 in the second direction axis DR2. The first group PXG1 and the second group PXG2 may each be provided in plurality. The first group PXG1 and the second group PXG2 may be alternately arranged along the second direction axis DR2.

One green light emitting region PXA-G may be disposed spaced apart from one blue light emitting region PXA-B or one red light emitting region PXA-R in a fourth direction axis DR4. The fourth direction axis DR4 may be a direction between the first direction axis DR1 and the second direction axis DR2.

The arrangement structure of the light emitting regions PXA-R, PXA-G, and PXA-B illustrated in FIG. 10 may be referred to as a pentile structure. However, the arrangement structure of the light emitting regions PXA-R, PXA-G, and PXA-B in the display panel DP according to an embodiment is not limited to the arrangement structure illustrated in FIG. 10. For example, in an embodiment, the light emitting regions PXA-R, PXA-G, and PXA-B may have a stripe structure in which the red light emitting region PXA-R, the green light emitting region PXA-G, and the blue light emitting region PXA-B are sequentially and alternately arranged along the first direction axis DR1.

The display panel DP according to an embodiment may be a light emitting-type display panel. For example, the display panel DP may be an organic electroluminescent display panel or a quantum dot light emitting display panel. However, the embodiment of the disclosure is not limited thereto.

When the display panel DP is an organic electroluminescent display panel, the light emitting element layer DD may include an organic electroluminescent element. Also, when the display panel DP is a quantum dot light emitting display panel, the light emitting element layer DD may include a quantum dot emission layer.

In an embodiment, the light emitting element ED may include a first electrode EL1 and a second electrode EL2 facing each other, and a plurality of functional layers FL disposed between the first electrode EL1 and the second electrode EL2. The functional layers FL may include a hole transport region HTR, a emission layer EML, and an electron transport region ETR.

As shown in FIG. 12, the light emitting element ED may include the first electrode EL1, the hole transport region HTR disposed on the first electrode EL1, the emission layer EML disposed on the hole transport region HTR, the electron transport region ETR disposed on the emission layer EML, and the second electrode EL2 disposed on the electron transport region ETR. The hole transport region HTR may include a hole injection layer HIL and a hole transport layer HTL, and the electron transport region ETR may include an electron injection layer EIL and an electron transport layer ETL. Also, the hole transport region HTR may include only one of the hole injection layer HIL and the hole transport layer HTL, and the electron transport region ETR may include only one of the electron injection layer EIL and the electron transport layer ETL. In the hole transport region HTR and the electron transport region ETR, any suitable hole transport material known in the art and any suitable electron transport material known in the art may be used, respectively.

In an embodiment, the hole transport region HTR may be disposed on the first electrode EL1 in an opening portion OH defined on the pixel defining layer PDL and may be disposed by being extended to an upper portion of the pixel defining layer PDL. However, the embodiment of the disclosure is not limited thereto. The hole transport region HTR may be patterned so as to be disposed inside the opening portion OH.

The emission layer EML may be provided on the hole transport region HTR. The emission layer EML may have a single-layered structure having a single layer formed of a single material, a single-layered structure having a single layer formed of a plurality of different materials, or a multi-layered structure having a plurality of layers formed of a plurality of different materials.

The emission layer EML is not particularly limited as long as it is any suitable material. For example, the emission layer EML may be formed of materials emitting red, green, and blue colors, and may include a fluorescent material or a phosphorescent material. In an embodiment, the emission layer EML may include a host and a dopant. For example, the emission layer EML may be disposed in the opening portion OH defined on the pixel defining layer PDL, but the embodiment of the disclosure is not limited thereto. When the display panel DP is an organic electroluminescent display panel, the emission layer EML may include a host and a dopant which is an organic electroluminescent material.

When the display panel DP according to an embodiment is a quantum dot light emitting display panel, the display panel DP may include a quantum dot material in the emission layer EML. A core of a quantum dot may be a Group II-VI compound, a Group compound, a Group III-V compound, a Group IV-VI compound, a Group IV element, a Group IV compound, or a combination thereof.

On the light emitting element ED, the encapsulation layer TFE may be disposed, and the encapsulation layer TFE may be disposed on the second electrode EL2. The encapsulation layer TFE may be directly disposed on the second electrode EL2. The same description as the description for the encapsulation layer TFE according to an embodiment described above may be applied to the encapsulation layer TFE.

Referring to FIG. 1 to FIG. 3 and FIG. 10 to FIG. 12, the display device DS of an embodiment may include the display panel DP, the input sensor TP disposed on the display panel DP, and a polarizing member PP disposed on the display panel DP. The polarizing member PP may be disposed on the input sensor TP.

In the display device DS of an embodiment, the display panel DP may include a base layer BL, a circuit layer CL and the light emitting element layer DD provided on the base layer BL, and the encapsulation layer TFE disposed on the light emitting element layer DD. Also, in the display device DS of an embodiment, the base layer BL of the display panel DP may be a member for providing a base surface on which the light emitting element layer DD is disposed. The base layer BL may be a glass substrate, a metal substrate, a plastic substrate, and the like. However, the embodiment of the disclosure is not limited thereto, and the base layer BL may be an inorganic layer, an organic layer, or a composite material layer.

In an embodiment, the circuit layer CL may be disposed on the base layer BL, and the circuit layer CL may include a plurality of transistors (not shown). Each of the transistors (not shown) may include a control electrode, an input electrode, and an output electrode. For example, the circuit layer CL may include a switching transistor and a driving transistor for driving the light emitting element ED.

The polarizing member PP may block external light provided to the display panel DP from the outside. The polarizing member PP may block a portion of the external light. For example, the polarizing member PP may block light having a wavelength of 380 nanometers (nm) or less.

Alternatively, the polarizing member PP may reduce reflection light generated in the display panel DP due to external light. For example, the polarizing member PP may serve to block reflection light which is generated when light provided from the outside of the display device DS is incident on the display panel DP and then emitted. The polarizing member PP may be a circular polarizer having an anti-reflection function, or the polarizing member PP may include a linear polarizer and a $\lambda/4$ phase retarder.

The input sensor TP may sense a direct touch of a user, an indirect touch of a user, a direct touch of an object, or an indirect touch of an object. In an embodiment, the input sensor TP may sense at least one of the position of a touch or the intensity (pressure) of a touch, which is applied externally. In an embodiment, the input sensor TP may have various configurations, or may be composed of various materials, and is not limited to any one embodiment. For example, in the display device DS of an embodiment, the input sensor TP may be a touch sensing unit for sensing a touch.

Also, the display device DS of an embodiment may further include a window member WP. The window member WP may define a front surface of the display device DS. The window member WP may stably protect the internal components of the display device DS from external impact. The window member WP may be formed by including a glass substrate or a plastic substrate.

In FIG. 2 and the like, the display device DS is illustrated as including all of the input sensor TP, the polarizing member PP, and the window member WP, but the embodiment of the disclosure is not limited thereto. On the contrary, in the display device DS of an embodiment, the polarizing member PP or the window member WP may be omitted.

In an embodiment, the sensitivity and sensing operation properties of the input sensor TP may be affected by other members disposed adjacent thereto. In the display device DS of an embodiment, the sensing properties of the input sensor TP may be affected by the dielectric constant of the encapsulation layer TFE disposed on a lower portion of the input sensor TP.

The display device DS of an embodiment may improve the sensing properties of the input sensor TP by allowing the encapsulation layer TFE to include the hollow polymer HP so as to have a low dielectric constant value, thereby reducing the parasitic capacitance Cp between the input sensor Tp and the encapsulating layer TFE. That is, the display device DS of an embodiment may include the hollow polymer HP and the fluorine-containing dispersant SA in at least one organic film OL of the encapsulation layer TFE, thereby reducing the dielectric constant of the organic film OL to 2.6 or less, so that the sensitivity of a touch sensed in the input sensor TP may be improved and touch noise may be reduced. In an embodiment, the touch noise may represent a phenomenon in which the input sensor TP cannot sense a touch applied externally, and the like.

Table 1 below shows the dielectric constant of an encapsulation layer organic film in Comparative Example and each of Examples, and the change rate of a Cp value between an input sensor and an encapsulation layer in a display device. Comparative Example shown in Table 1 corresponds to a display device including an encapsulation layer which does not include both a hollow polymer structure and a fluorine-containing dispersant in an organic film. Example 1 is an embodiment in which a hollow polymer structure is included in an organic film, and in Example 2 to Example 6, a hollow polymer structure and a fluorine-containing dispersant are both included in an organic film. Examples 2 to 4 show embodiments according to different contents of a fluorine-containing dispersant with respect to the constant hollow polymer content. Examples 5 and Example 6 show embodiments in which the content of a hollow polymer structure content is changed when compared to Example 4.

TABLE 1

| Classification | Hollow polymer structure content (wt %) | Fluorine-containing dispersant content (wt %) | Dielectric constant | Cp improvement rate (%) |
|---|---|---|---|---|
| Comparative Example | 0 | 0 | 2.89 | 100 |
| Example 1 | 20 | 0 | 2.32 | 113 |
| Example 2 | 20 | 1 | 2.29 | 114 |
| Example 3 | 20 | 2 | 2.27 | 116 |
| Example 4 | 20 | 5 | 2.23 | 119 |
| Example 5 | 10 | 5 | 2.43 | 108 |
| Example 6 | 30 | 5 | 2.15 | 125 |

The Cp improvement rate shown in Table 1 represents the degree of decrease in Cp value in a ratio when the Cp value in Comparative Example was set to 100%. For example, the Cp improvement rate of 113% in Example 1 represents an embodiment in which the Cp value in Comparative Example is 100 and the Cp value in Example 1 is 87. For example, the Cp improvement rate may be represented by Equation 1 below.

$$Cp \text{ improvement rate } (\%) = 100 + \frac{Cp_0 - Cp}{Cp_0} \qquad \text{Equation 1}$$

In Equation 1, $Cp_0$ is a Cp value in Comparative Example, and Cp corresponds to a Cp value in each of Examples.

Referring to the results shown in Table 1, it can be confirmed that the dielectric constant value in the organic film was as low as 2.5 or less in each of Examples when compared with Comparative Example. That is, when the encapsulation layer of each of Examples includes a hollow polymer structure, it may exhibit a lower dielectric constant value than the encapsulation layer of Comparative Example. Also, the Cp value was reduced in all of Examples when compared with the Cp value of Comparative Example, resulting in the improvement of the Cp value.

Referring to Example 2 to Example 4, it can be seen that as the content of a fluorine-containing dispersant in the constant hollow polymer content was increased, the dielectric constant value in an organic film was decreased, and accordingly, the Cp improvement rate was increased. This is because the greater the content of the fluorine-containing dispersant, the hollow polymer was more uniformly dispersed in the organic film, and accordingly, the dielectric constant value was decreased.

Referring to Example 4 to Example 6, it can be seen that as the content of a hollow polymer structure in the constant fluorine-containing dispersant content is increased, the dielectric constant value in an organic film was decreased, and accordingly, the Cp improvement rate was increased. This is because the hollow polymer itself has low dielectric constant properties, so that the greater the hollow polymer content, the ratio of the hollow polymer in the entire organic film was increased, and accordingly, the dielectric constant value of the organic film was decreased.

A display device of an embodiment includes a light emitting element layer, an encapsulation layer disposed on the light emitting element layer, and an input sensor disposed on the encapsulation layer, wherein the encapsulation layer includes a hollow polymer structure, thereby reducing the dielectric constant of the encapsulation layer, so that the sensitivity properties of the input sensor disposed on the encapsulation layer may be improved. A display device according to an embodiment includes a hollow polymer structure and a fluorine-containing dispersant in an organic film of an encapsulation layer, thereby reducing the parasitic capacitance between the encapsulation layer and an input sensor, so that even when a thin encapsulation layer is used, the sensing malfunction of the input sensor may be reduced and the sensitivity of the input sensor may be increased.

An embodiment of the disclosure may provide a display device including an encapsulation layer having a low dielectric constant value by including a hollow polymer structure.

An embodiment may provide a display device having the improved operation quality of an input sensor provided on an encapsulation layer by allowing the encapsulation layer to include a hollow polymer structure and a fluorine-containing dispersant, thereby having a low dielectric constant value.

Although the disclosure has been described with reference to what is presently considered to be practical example embodiments, it will be understood by those skilled in the art that various changes in form and details may be made therein without departing from the spirit and scope of the disclosure.

Accordingly, the technical scope of the disclosure is not intended to be limited to the contents set forth in the detailed description of the specification, but on the contrary, is intended to cover various modifications and equivalent arrangements included within the spirit and scope of the appended claims.

What is claimed is:

1. A display device, comprising:
a light emitting element layer;
an encapsulation layer disposed on the light emitting element layer, wherein the encapsulation layer comprises a hollow polymer structure; and
an input sensor disposed on the encapsulation layer.

2. The display device of claim 1, wherein the encapsulation layer further comprises a fluorine-containing dispersant.

3. The display device of claim 2, wherein the encapsulation layer comprises at least one organic film and at least one inorganic film, and wherein the at least one organic film comprises the hollow polymer structure and the fluorine-containing dispersant.

4. The display device of claim 1, wherein the hollow polymer structure comprises a core part filled with air and a shell part surrounding the core part.

5. The display device of claim 4, wherein the shell part comprises a (meth)acryl polymer, an imide polymer, a urethane polymer, a styrenic polymer, a siloxane polymer, an epoxy polymer, or a combination thereof.

6. The display device of claim 4, wherein the shell part comprises polymethylmethacrylate, polyimide, polyurethane, polystyrene, polycarbonate, polyethylene, polypropylene, or cellulose acetate.

7. The display device of claim 4, wherein the hollow polymer structure has a spherical shape having an average diameter of 10 manometers to 200 nanometers.

8. The display device of claim 4, wherein the shell part has a thickness of 5 nanometers to 50 nanometers.

9. The display device of claim 2, wherein the fluorine-containing dispersant is represented by Formula 1 or a reaction product of thereof:

Formula 1 wherein in the Formula 1, $X_1$ and $X_2$ are each independently a reactive group comprising an acrylate group or a fluorine atom, Y is O, S, $CR_1R_2$, or $NR_3$, $R_1$ to $R_3$ are each independently a hydrogen atom, or a fluorine atom, $R_a$ to $R_f$ are each independently a fluorine atom or $(CF_2)_zCF_3$, n is an integer of 1 to 5, and m and z are each independently an integer of 1 to 10.

10. The display device of claim 3, wherein the at least one organic film and the at least one inorganic film are alternately stacked.

11. The display device of claim 1, wherein the encapsulation layer covers the light emitting element layer.

12. The display device of claim 1, wherein the light emitting element layer is an organic electroluminescent element layer or a quantum dot light emitting element layer.

13. The display device of claim 1, wherein the input sensor is directly disposed on the encapsulation layer.

14. A display device comprising:
a light emitting element layer;
an encapsulation layer disposed on the light emitting element layer; and
an input sensor disposed on the encapsulation layer,
wherein the encapsulation layer comprises at least one organic film formed from an encapsulation composition comprising a base resin, a hollow polymer, and a fluorine-containing dispersant.

15. The display device of claim 14, wherein the encapsulation composition comprises 45 weight percent to 88 weight percent of the base resin, 10 weight percent to 50 weight percent of the hollow polymer, and 1 weight percent to 5 weight percent of the fluorine-containing dispersant, based on the total weight of the encapsulation composition.

16. The display device of claim 14, wherein the base resin comprises a (meth)acryl unit, a silicone unit, a urethane unit monomer, an imide unit, or a combination thereof.

17. The display device of claim 14, wherein the hollow polymer comprises a core part filled with air and a shell part surrounding the core part.

18. The display device of claim 14, wherein the fluorine-containing dispersant comprises a polymerizable reactive group which reacts with the base resin.

19. The display device of claim 14, wherein the encapsulation layer further comprises at least one inorganic film and the at least one organic film,
wherein the at least one organic film and the at least one inorganic film are alternately stacked, and
the at least one inorganic film comprises at least one of SiNx, SiOx, or SiOxNy.

20. The display device of claim 14, wherein the at least one organic film has a dielectric constant of 1.0 to 2.6.

* * * * *